(12) United States Patent
Tanaka et al.

(10) Patent No.: US 8,958,000 B2
(45) Date of Patent: Feb. 17, 2015

(54) IMAGING DEVICE, METHOD FOR CONTROLLING IMAGING DEVICE, AND STORAGE MEDIUM STORING A CONTROL PROGRAM

(71) Applicant: FUJIFILM Corporation, Tokyo (JP)

(72) Inventors: Seiji Tanaka, Saitama (JP); Kenkichi Hayashi, Saitama (JP); Tomoyuki Kawai, Saitama (JP); Hidekazu Kurahashi, Saitama (JP); Noriko Kawamura, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/315,505

(22) Filed: Jun. 26, 2014

(65) Prior Publication Data

US 2014/0307137 A1  Oct. 16, 2014

Related U.S. Application Data

(63) Continuation of application No. PCT/JP2012/083976, filed on Dec. 27, 2012.

(30) Foreign Application Priority Data

Dec. 27, 2011  (JP) ................................ 2011-286692

(51) Int. Cl.
*H04N 5/335* (2011.01)
*H04N 9/04* (2006.01)

(52) U.S. Cl.
CPC .................... *H04N 9/045* (2013.01)
USPC .......................................... 348/273; 348/280

(58) Field of Classification Search
CPC .................................................. H04N 5/335
USPC ................................................ 348/272–283
See application file for complete search history.

(56) References Cited

U.S. PATENT DOCUMENTS 6,995,796 B2  2/2006  Taubman
8,836,813 B2*  9/2014  Hatano ...................... 348/222.1
(Continued)

FOREIGN PATENT DOCUMENTS

JP  8-23542 A  1/1996
JP  8-23543 A  1/1996
(Continued)

OTHER PUBLICATIONS

International Search Report issued in PCT/JP2012/083976, mailed on Feb. 5, 2013.
(Continued)

*Primary Examiner* — Tuan Ho
(74) *Attorney, Agent, or Firm* — Birch, Stewart, Kolasch & Birch, LLP

(57) ABSTRACT

Efficient thinned reading is performed in a case in which an image pickup device equipped with a color filter having an array different from a Bayer array is employed.
An imaging apparatus (10) includes: an image pickup device (14) containing plural photoelectric conversion elements arrayed in first and second directions; a color filter having a repeatedly disposed basic array pattern of array lines that include the first and second filters in the second direction, and include a plurality of matching array lines that have the same array as each other along the second direction, and at least one array line that has a different array for the first or second filters in the second direction to that of the matching array lines; and an image processing section (20) that reads pixel signals of the plural pixels at a set cycle from the image pickup device (14), generates line image data for each of the matching array lines in the basic array pattern from out of the plural pixels, and sums together pixels that are the same color pixel as each other in the generated line image data, and generates image data based on the line image data that has been pixel summed.

14 Claims, 15 Drawing Sheets

(56) References Cited

U.S. PATENT DOCUMENTS

| | | |
|---|---|---|
| 2002/0149686 A1 | 10/2002 | Taubman |
| 2002/0158979 A1* | 10/2002 | Jaspers ............... 348/272 |
| 2004/0109068 A1 | 6/2004 | Mitsunaga et al. |
| 2004/0169747 A1 | 9/2004 | Ono et al. |
| 2006/0203113 A1 | 9/2006 | Wada et al. |
| 2006/0222269 A1 | 10/2006 | Ohno |
| 2007/0153104 A1 | 7/2007 | Ellis-Monaghan et al. |
| 2008/0151083 A1 | 6/2008 | Hains et al. |
| 2010/0013948 A1 | 1/2010 | Azuma et al. |
| 2011/0069189 A1 | 3/2011 | Venkataraman et al. |
| 2011/0134293 A1* | 6/2011 | Tanaka ............... 348/280 |
| 2012/0025060 A1 | 2/2012 | Iwata |

FOREIGN PATENT DOCUMENTS

| | | |
|---|---|---|
| JP | 11-285012 A | 10/1999 |
| JP | 2000-308080 A | 11/2000 |
| JP | 2002-135793 A | 5/2002 |
| JP | 2004-221839 A | 8/2004 |
| JP | 2004-266369 A | 9/2004 |
| JP | 2005-136765 A | 5/2005 |
| JP | 2005-136766 A | 5/2005 |
| JP | 2007-184904 A | 7/2007 |
| JP | 3960965 B2 | 8/2007 |
| JP | 2007-306490 A | 11/2007 |
| JP | 2008-236620 A | 10/2008 |
| JP | 2010-512048 A | 4/2010 |
| JP | 2010-153511 A | 7/2010 |
| JP | 2010-233241 A | 10/2010 |
| JP | 2011-523538 A | 8/2011 |
| WO | WO 02/056604 A1 | 7/2002 |
| WO | WO 2008/066698 A2 | 6/2008 |
| WO | WO 2009/031287 A1 | 3/2009 |
| WO | WO 2009/151903 A2 | 12/2009 |

OTHER PUBLICATIONS

Office Action issued in Chinese Patent Application No. 201180022503.3 file on May 23, 2013.

PCT/ISA/237—Issued in PCT/JP2012/080898, mailed on Jan. 22, 2013.

PCT/ISA/237—Issued in PCT/JP2012/080899, mailed on Jan. 15, 2013.

PCT/ISA/237—Issued in PCT/JP2012/081644, mailed on Jan. 15, 2013.

PCT/ISA/237—Issued in PCT/JP2012/083583, mailed on Jan. 29, 2013.

PCT/ISA/237—Issued in PCT/JP2012/083976, mailed on Feb. 5, 2013.

* cited by examiner

FIG.4

| | A ARRAY | | | B ARRAY | | | | | |
|---|---|---|---|---|---|---|---|---|---|
| G | B | G | G | R | G | G | B | G |
| R | G | R | B | G | B | R | G | R |
| G | B | G | G | R | G | G | B | G |
| G | R | G | G | B | G | G | R | G |
| B | G | B | R | G | R | B | G | B |
| G | R | G | G | B | G | G | R | G |
| G | B | G | G | R | G | G | B | G |
| R | G | R | B | G | B | R | G | R |
| G | B | G | G | R | G | G | B | G |

FIG.13

| G | B | R | B | G |
|---|---|---|---|---|
| R | G | B | G | R |
| B | R | G | R | B |
| R | G | B | G | R |
| G | B | R | B | G |

FIG.14

| G | R | B | G | R | B | G | G | R | B | G | R | B | G |
|---|---|---|---|---|---|---|---|---|---|---|---|---|---|
| R | G | G | B | G | G | R | R | G | G | B | G | G | R |
| B | G | G | R | G | G | B | B | G | G | R | G | G | B |
| G | R | B | G | B | R | G | G | R | B | G | B | R | G |
| B | G | G | R | G | G | B | B | G | G | R | G | G | B |
| R | G | G | B | G | G | R | R | G | G | B | G | G | R |
| G | B | R | G | B | R | G | G | B | R | G | B | R | G |
| G | R | B | G | R | B | G | G | R | B | G | R | B | G |
| R | G | G | B | G | G | R | R | G | G | B | G | G | R |
| B | G | G | R | G | G | B | B | G | G | R | G | G | B |
| G | R | B | G | B | R | G | G | R | B | G | B | R | G |
| B | G | G | R | G | G | B | B | G | G | R | G | G | B |
| R | G | G | B | G | G | R | R | G | G | B | G | G | R |
| G | B | R | G | B | R | G | G | B | R | G | B | R | G |

P labels the top-left region.

FIG.15

| | | | | | | | | | | | | | | |
|---|---|---|---|---|---|---|---|---|---|---|---|---|---|---|
| R | B | G | R | B | R | E | B | R | B | G | R | B | R | E | B |
| G | G | G | B | E | G | G | R | G | G | G | B | E | G | G | R |
| B | G | G | G | R | G | G | E | B | G | G | G | R | G | G | E |
| R | G | B | R | B | E | R | B | R | G | B | R | B | E | R | B |
| B | R | E | B | R | B | G | R | B | R | E | B | R | B | G | R |
| E | G | G | R | G | G | G | B | E | G | G | R | G | G | G | B |
| R | G | G | E | B | G | G | G | R | G | G | E | B | G | G | G |
| B | E | R | B | R | G | B | R | B | E | R | B | R | G | B | R |
| R | B | G | R | B | R | E | B | R | B | G | R | B | R | E | B |
| G | G | G | B | E | G | G | R | G | G | G | B | E | G | G | R |
| B | G | G | G | R | G | G | E | B | G | G | G | R | G | G | E |
| R | G | B | R | B | E | R | B | R | G | B | R | B | E | R | B |
| B | R | E | B | R | B | G | R | B | R | E | B | R | B | G | R |
| E | G | G | R | G | G | G | B | E | G | G | R | G | G | G | B |
| R | G | G | E | B | G | G | G | R | G | G | E | B | G | G | G |
| B | E | R | B | R | G | B | R | B | E | R | B | R | G | B | R |

IMAGING DEVICE, METHOD FOR CONTROLLING IMAGING DEVICE, AND STORAGE MEDIUM STORING A CONTROL PROGRAM

CROSS-REFERENCE TO RELATED APPLICATIONS

This application is a continuation application of International Application No. PCT/JP2012/083976, filed Dec. 27, 2012, the disclosure of which is incorporated herein by reference in its entirely. Further, this application claims priority from Japanese Patent Application No. 2011-286692, filed Dec. 27, 2011.

BACKGROUND

1. Technical Field

The present invention relates to an imaging apparatus, and a control method and a control program for an imaging apparatus, and in particular to an imaging apparatus equipped with a color image pickup device, and a control method and control program for an imaging apparatus of the same.

2. Related Art

A primary color system Bayer array (see, for example, Patent Documents 1 to 3), this being a color array widely employed in color image pickup devices, has red (R) and blue (B) placed in sequential lines of a chessboard pattern of green (G) pixels, to which the human eye is most sensitive and that contribute most to obtaining a brightness signal.

Patent Document 1: Japanese Patent Application Laid-Open (JP-A) No. 2002-135793
Patent Document 2: Japanese Patent No. 3960965
Patent Document 3: JP-A No. 2004-266369

Technical Problem

However, in a color image pickup device that employs a conventional Bayer array, for example in cases in which thinned reading is performed in the vertical direction in order to generate image data for video use, in situations where for example one lines worth of image data has been read for each 2n lines (wherein n is a positive integer) in the vertical direction (vertical direction ½n thinning, even number thinning), this results in line image data being read that only contains two colors: G and R, or G and B, and so color reproduction is not possible. Therefore, in thinned reading, generally one line's worth of image data is read for each (2n+1) lines (vertical direction 1/(2n+1) thinning, odd number thinning). Moreover, in other cases in which thinned reading is performed, in order to obtain color reproduction, horizontal lines containing G and R, and horizontal lines containing G and B need to be read alternately, placing severe limitations on reading methods.

Moreover, in a Bayer array, there is a problem with reproduction precision when generating high frequency signals in diagonal directions for G signals, and in the horizontal direction and the vertical direction for R and B signals, there is a problem of an inability to suppress generation of color moiré (false color) for high frequency signals, and when thinned reading is performed as described above, since the same color array results as that of the original Bayer array, the same problems occur.

SUMMARY

The present invention has been configured to solve the above problems, and an object thereof is to provide an imaging apparatus, and a control method and a control program for an imaging apparatus, that enable efficient thinned reading to be performed in cases in which an image pickup device equipped with a color filter with an array other than a Bayer array is employed.

Solution to Problem

In order to solve the above problems, an imaging apparatus of the present invention includes: an image pickup device including plural photoelectric conversion elements arrayed in a predetermined first direction and a second direction intersecting with the first direction; a color filter that is provided above plural pixels configured by the plural photoelectric conversion elements, the color filter having a repeatedly disposed basic array pattern of array lines that each include in the second direction at least one of each of a first filter corresponding to a first color that contributes most to obtaining a brightness signal or each of plural second filters respectively corresponding to 2 or more second colors other than the first color, and include plural matching array lines that have the same array as each other along the second direction, and at least one array line that has a different array for the first filter and the second filters in the second direction to that of the matching array lines; a line image data generation section that reads pixel signals of the plural pixels at a set cycle from the image pickup device, and, from the read pixel signals, generates, from out of the plural pixels, line image data of each of the matching array lines in the basic array pattern; a pixel summing section that sums together pixels that are the same color pixel as each other in the generated line image data for the matching array lines; and an image data generation section that generates image data based on the line image data that has been pixel summed.

According to this invention, the color filter includes plural lines of matching arrays in the basic array pattern, and an improvement in the S/N ratio of the image is enabled since pixel summing processing is executed that sums together pixels that are the same color pixel as each other in generated line image data of matching arrays.

Note that the line image data generation section may generate line image data that has a different array for each of the first color and each of the 2 or more second colors to that of the matching array lines, such that there is at least one each of the first color and each of the 2 or more second colors included in each line running along the first direction.

According to this invention, since there is at least one each of the first color and each of the 2 or more second colors included in each line running along the first direction in the image after pixel summing, an improvement in image quality is enabled in the image after pixel summing compared to cases in which there are pixels of only one color disposed in the line running along the first direction.

Moreover, the line image data generation section may generate line image data with positions in the first direction at positions sandwiched by the matching array lines.

According to this invention, since line image data of each matching array line is generated and pixel summing performed, and line image data with positions in the first direction at positions sandwiched by the matching array lines is generated, the position of the center of gravity in the first direction of the line image data that is pixel summed, matches the position of line image data at the position sandwiched by the matching array lines. Moreover, since the image after pixel summing includes at least one each of the first color and each of the 2 or more second colors included in each line running along the first direction, an improvement in image quality is enabled, compared to cases in which there are pixels of only the first color disposed in a line running along the first direction.

Moreover, the line image data generation section may generate line image data of the matching array lines having the closest position to each other in the first direction.

According to this invention, since line image data is respectively generated and pixel summed for matching array lines that are positioned closest to each other in the first direction, images with excellent quality are obtained.

Moreover, the line image data generation section, as the set cycle for reading pixel signals of the plural pixels from the image pickup device, may read the pixel signals of the matching array lines in the basic array pattern out of the plural pixels and generate line image data.

Moreover, configuration may be made such that: at least one of the first filters is placed in each line in the color filter in the first direction, the second direction, and third directions that intersect with the first direction and the second direction; and at least one of each of plural of the second filters is placed in each line of the basic array pattern in the first direction and the second direction.

According to this invention, the first filter that corresponds to the first color that contributes most to obtaining a brightness signal is placed in each line in the color filter in the first direction to the third directions, thereby enabling reproduction precision of synchronization processing to be raised in high frequency regions. Moreover, the second filters that respectively correspond to each color of the 2 or more second colors other than the first color are placed such that there is 1 or more of each in each line in the basic array pattern in the first direction and the second direction, thereby enabling generation of color moiré (false color) to be reduced and enabling higher definition images to be achieved.

Moreover, the color filter may include a square array corresponding to 2×2 pixels configured from the first filter.

According to this invention, which direction, out of each of the four directions, is the brightness correlation direction can be determined by determination of the minimum pixel separation based on difference values of pixel values between each of the pixels of the 4 pixels of the square array corresponding to the 2×2 pixels.

Moreover, configuration may be made such that the first color is green (G), and the second colors are red (R) and blue (B).

Moreover, configuration may be made such that: the color filter includes an R filter, a G filter, and a B filter corresponding to colors red (R), green (G) and blue (B); and the color filter is configured by a first array and a second array alternately arrayed in the first direction and the second direction, in which the first array corresponds to 3×3 pixels with the G filter placed at the center and the 4 corners, the B filter placed at the top and bottom of the central G filter, and the R filter placed at the left and right of the central G filter, and the second array corresponds to 3×3 pixels with the G filter placed at the center and the 4 corners, the R filter placed at the top and bottom of the central G filter, and the B filter placed at the left and right of the central G filter.

According to this invention, if 5×5 pixels (a local region of a mosaic image) are extracted centered on the first array or the second array, 2×2 pixels of G pixels are present at the 4 corners of the 5×5 pixels. The pixel values of these 2×2 pixels of G pixels can be employed to determine the correlation direction out of 4 directions.

Moreover, configuration may be made such that: the color filter includes an R filter, a G filter, and a B filter corresponding to colors red (R), green (G) and blue (B); and the color filter is configured by a first array and a second array alternately arrayed in the first direction and the second direction, in which the first array corresponds to 3×3 pixels with the R filter placed at the center, the B filter placed at the 4 corners, and the G filter placed at the top, bottom, left and right of the central R filter, and the second array corresponds to 3×3 pixels with the B filter placed at the center, the R filter placed at the 4 corners, and the G filter placed at the top, bottom, left and right of the central B filter.

According to this invention, if 5×5 pixels (a local region of a mosaic image) are extracted centered on the first array or the second array, there is a G pixel present in adjacent contact on either side in the horizontal direction and the vertical direction of the central pixel (the R pixel or the B pixel) of the 5×5 pixels. The pixel values of these G pixels (a total of 8 pixels) can be employed to determine the correlation direction out of 4 directions.

Moreover, configuration may be made such that the color filter has point symmetry about the center of the basic array pattern.

According to this invention, a reduction in the circuit scale of a processing circuit at a later stage is enabled.

A control method of the present invention is a control method for an imaging apparatus equipped with an image pickup device including plural photoelectric conversion elements arrayed in a predetermined first direction and a second direction intersecting with the first direction, and a color filter that is provided above plural pixels configured by the plural photoelectric conversion elements, the color filter having a repeatedly disposed basic array pattern of array lines that each include in the second direction at least one of each of a first filter corresponding to a first color that contributes most to obtaining a brightness signal or each of plural second filters respectively corresponding to 2 or more second colors other than the first color, and include plural matching array lines that have the same array as each other along the second direction, and at least one array line that has a different array for the first filter and the second filters in the second direction to that of the matching array lines. The control method for an imaging apparatus including: a line image data generation section that reads pixel signals of the plural pixels at a set cycle from the image pickup device, and from the read pixel signals, generates, from out of the plural pixels, line image data of each of the matching array lines in the basic array pattern; a pixel summing section that sums together pixels that are the same color pixel as each other in the generated line image data for the matching array lines; and an image data generation section that generates image data based on the line image data that has been pixel summed.

A control program of the present invention is a control program that causes processing to be executed in a computer that controls an imaging apparatus equipped with an image pickup device including plural photoelectric conversion elements arrayed in a predetermined first direction and a second direction intersecting with the first direction, and a color filter that is provided above plural pixels configured by the plural photoelectric conversion elements, the color filter having a repeatedly disposed basic array pattern of array lines that each include in the second direction at least one of each of a first filter corresponding to a first color that contributes most to obtaining a brightness signal or each of plural second filters respectively corresponding to 2 or more second colors other than the first color, and include plural matching array lines that have the same array as each other along the second direction, and at least one array line that has a different array for the first filter and the second filters in the second direction to that of the matching array lines. The control program including: a step of reading pixel signals of the plural pixels at a set cycle from the image pickup device; a step of from the read pixel signals, generating, from out of the plural pixels, line image data of each of the matching array lines in the basic array pattern; a step of summing together pixels that are the same color pixel as each other in the generated line image data for the matching array lines; and a step of generating image data based on the line image data that has been pixel summed.

A control program of the present invention is a control program that causes processing to be executed in a computer, the processing including: a step of generating line image data from pixel signals of pixel signals in plural pixels read at a set cycle from an image pickup device including plural photoelectric conversion elements arrayed in a predetermined first direction and a second direction intersecting with the first direction, and a color filter that is provided above plural pixels configured by the plural photoelectric conversion elements, the color filter having a repeatedly disposed basic array pattern of array lines that each include in the second direction at least one of each of a first filter corresponding to a first color that contributes most to obtaining a brightness signal or each of plural second filters respectively corresponding to 2 or more second colors other than the first color and include plural matching array lines that have the same array as each other along the second direction, and at least one array line that has a different array for the first filter and the second filters in the second direction to that of the matching array lines, the line image data being generated for the matching array lines in the basic array pattern out of the plural pixels; a step of summing together pixels that are the same color pixel as each other in the generated line image data for the matching array lines; and a step of generating image data based on the line image data that has been pixel summed.

Advantageous Effects of Invention

According to the present invention, the advantageous effect is exhibited of enabling effective thinned reading to be performed in cases in which an image pickup device equipped with a color filter with an array other than a Bayer array is employed.

BRIEF DESCRIPTION OF DRAWINGS

FIG. 4 is a diagram illustrating a color filter in which 6×6 pixel basic array patterns contained in a color filter according to the first exemplary embodiment are split into 3×3 pixel A arrays and B arrays that are repeatedly disposed along a horizontal direction and a vertical direction.

FIG. 13 is a diagram of a modified example of a color filter.
FIG. 14 is a diagram of a modified example of a color filter.
FIG. 15 is a diagram of a modified example of a color filter.

DESCRIPTION OF EMBODIMENTS

Explanation follows regarding exemplary embodiments of the present invention, with reference to the drawings.

First Exemplary Embodiment

Figure 1:
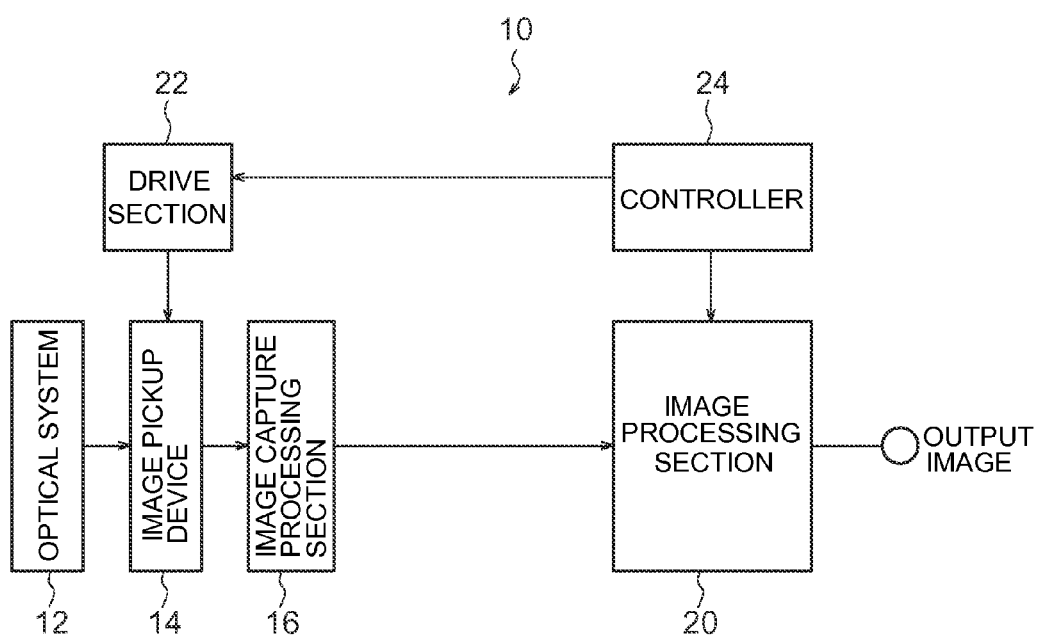
FIG. 1 is a schematic block diagram of an imaging apparatus according to a first exemplary embodiment.

FIG. 1 is a schematic block diagram illustrating an imaging apparatus 10 according to the present exemplary embodiment. The imaging apparatus 10 is configured including an optical system 12, an image pickup device 14, an image capture processing section 16, an image processing section 20, a drive section 22, and a controller 24.

The optical system 12 is configured including, for example, a lens set configured from plural optical lenses, an aperture adjustment mechanism, a zoom mechanism, and an automatic focusing mechanism.

The image pickup device 14 is what is referred to as a 1-chip image pickup device configured by an image pickup device, such as for example a Charge Coupled Device (CCD) or a Complementary Metal Oxide Semiconductor (CMOS), containing plural photoelectric conversion elements arrayed in the horizontal direction and vertical direction, with a color filter disposed above the image pickup device.

Figure 2:
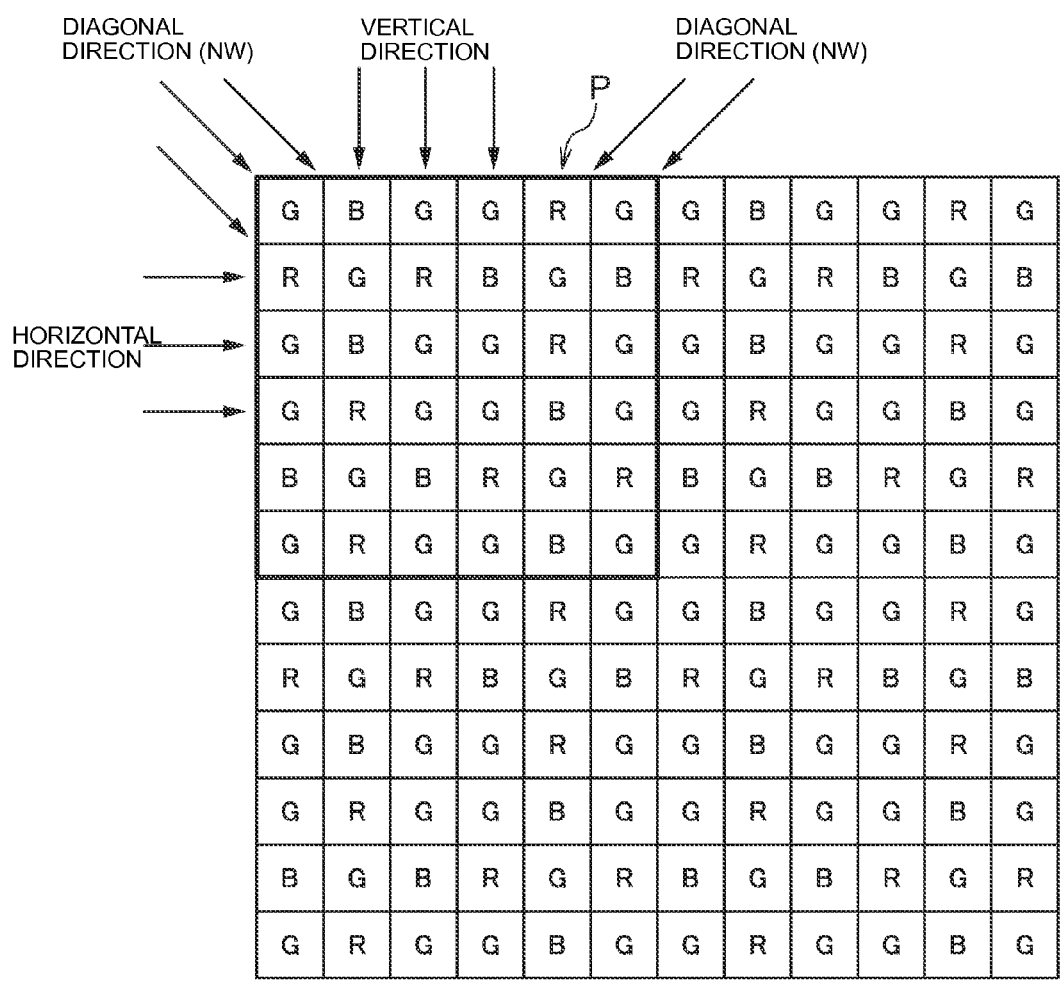
FIG. 2 is a configuration diagram of a color filter according to the first exemplary embodiment.

FIG. 2 illustrates a portion of a color filter according to the present exemplary embodiment. One out of 3 primary color filters red (R), green (G) and blue (B) is placed over each of the pixels.

Color Filter Array Features

The color filter of the first exemplary embodiment includes the following features (1) to (6).

Feature (1)

The color filter array has a repeatedly disposed basic array pattern of a predetermined pattern of (N×M) pixels (wherein N, M are integers of 3 or more) in the vertical direction and the horizontal direction of the 3 primary color filters red (R), green (G) and blue (B), wherein the green (G) filter and at least one color filter out of the red (R) or the blue (B) is placed in each of the vertical direction and the horizontal direction.

The color filter according to the present exemplary embodiment illustrated in FIG. 2 includes a basic array pattern P (the pattern indicated by the bold frame) formed from square array patterns corresponding to, as an example, 6×6 pixels (N=M=6), with the basic array pattern P disposed so as to repeat in both the vertical direction (a first direction) and the horizontal direction (a second direction). Namely, the color filter is arrayed such that the respective filters of each color R, G, B (the R filters, G filters, B filters) have a specific periodicity.

Thus arraying the R filters, G filters and B filters with a specific periodicity enables processing to be performed in a repeating pattern during, for example, synchronization processing (also referred to as demosaic processing, the same applies below) of R, G, B signals read from the color image pickup device.

Feature (2)

The color filter array illustrated in FIG. 2 has the G filter, that corresponds to the color contributing the most to obtaining a brightness signal (the color G in the present exemplary embodiment) placed in each line in the color filter array in the vertical direction that is the first direction, the horizontal direction that is the second direction, and third directions in the color filter plane that intersect with the first direction and the second direction, namely diagonal directions (NE, NW) (third directions). Note that NE means a diagonal direction toward the top right, and NW means a diagonal direction toward the bottom right. For example, for a square pixel array, the diagonal top right direction and the diagonal bottom right direction are directions at 45° with respect to the horizontal direction. However, in a rectangular pixel array, these are the directions of the pair of diagonals of a rectangle, and their angle varies according to the lengths of the long sides and the short sides.

Placing the G filters, corresponding to the brightness system pixels, in each of the lines in the vertical direction, horizontal direction, and diagonal directions (NE, NW) of the color filter array enables the reproduction precision of synchronization processing to be raised in high frequency regions, irrespective of the directionality of the high frequency.

Feature (3)

In the color filter array illustrated in FIG. 2, 1 or more of each of the R filter and the B filter, corresponding to the 2 or more colors other than the above color G (colors R, B in the present exemplary embodiment), is disposed in each line in the basic array pattern P in the vertical direction and horizontal direction of the color filter array.

Disposing the R filter and the B filter in each line in the vertical direction and horizontal direction of the color filter array enables generation of color moiré (false color) to be reduced.

This thereby enables an optical low pass filter for suppressing false color generation to be omitted from placement on the optical path of the optical system, from the incident face to the imaging plane, or, even in cases in which an optical low pass filter is applied, one can be employed that has a weak action to cut the high frequency components to prevent false color generation, thereby enabling deterioration of resolution to be avoided.

Feature (4)

Figure 3:
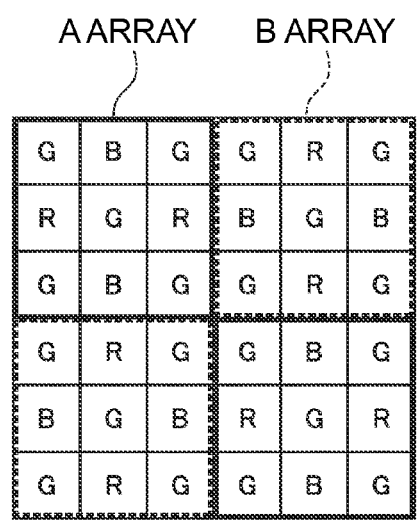
FIG. 3 is a diagram illustrating a basic array pattern contained in a color filter according to the first exemplary embodiment.

FIG. 3 illustrates a state in which the basic array pattern P illustrated in FIG. 2 has been divided into 4 sets of 3×3 pixels.

The basic array pattern P, as illustrated in FIG. 3, may be achieved by arraying an A array of the 3×3 pixels surrounded by the solid line frame, and a B array of the 3×3 pixels surrounded by the broken line frame, so as to be alternately disposed along the horizontal and vertical directions.

In both the A array and the B array, the G filters that are the brightness system pixels are placed at the 4 corners and at the center, thereby being placed over both diagonal lines. In the A array, R filters are placed on both sides of the central G filter in the horizontal direction, and B filters are placed on both sides of the central G filter in the vertical direction. However in the B array, B filters are placed on both sides of the central G filter in the horizontal direction, and R filters are placed on both sides of the central G filter in the vertical direction. Namely, the A array and the B array have reverse positional relationships for the R filters and the B filters, but have similar placement otherwise.

Due to disposing the A array and the B array alternately in the vertical direction and the horizontal direction, as illustrated in FIG. 4, the 4 corner G filters in the A array and the B array form square array G filters corresponding to 2×2 pixels.

Namely, the color filter array (basic array pattern P) illustrated FIG. 2 includes square arrays corresponding to 2×2 pixels configured by G filters.

Figure 5:
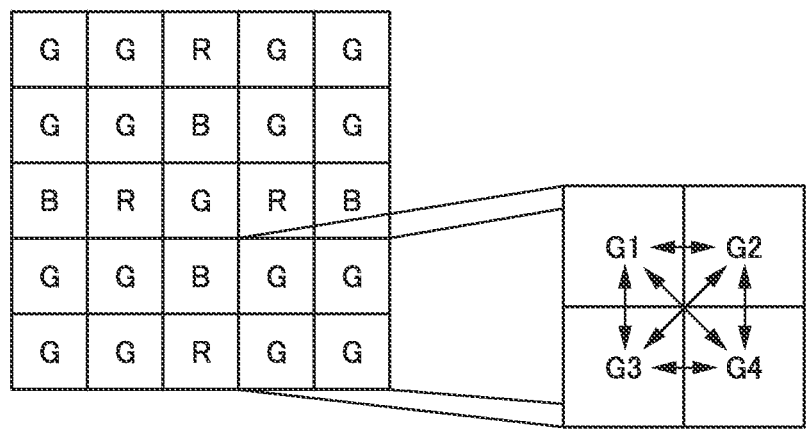
FIG. 5 is a diagram illustrating a distinctive placement of G pixels in a color filter according to the first exemplary embodiment.

When, as illustrated in FIG. 5, a 5×5 pixel local region centered on an A array is extracted from a mosaic image output from the image pickup device 14, the 2×2 pixels of pixels at the 4 corners in the local region are disposed as illustrated in FIG. 5.

As illustrated in FIG. 5, taking the pixel values of the 2×2 pixels of G pixels as G1, G2, G3, G4 in sequence from top left to bottom right, the vertical direction difference absolute value of the pixel values of these G pixels is (|G1−G3|+|G2−G4|)/2, the difference absolute value in the horizontal direction is (|G1−G2|+|G3−G4|)/2, the difference absolute value in the diagonal direction towards the top right is |G2−G3|, and the difference absolute value in the diagonal direction towards the top left is |G1−G4|.

The correlation (correlation direction) can then be determined as the direction with the smallest difference absolute value out of these four correlation absolute values.

As illustrated in FIG. 4 or FIG. 5, when a 5×5 pixel local region is extracted from a mosaic image such that the 3×3 pixel A array is positioned at its center, there are 2×2 pixels of G pixels placed at the 4 corners thereof. Consequently, when the 3×3 pixels of the A array inside the above local region are pixels subject to synchronization processing, the sums (or the average values) of the correlation absolute values of the 4 corners are derived separately for each direction, and the direction having the smallest value out of the sums (or the average values) of the correlation absolute values for each direction is determined as the brightness correlation direction of the pixels subject to synchronization processing. The determined correlation direction may be employed when performing synchronization Feature (5)

Moreover, the basic array pattern P configuring the color filter array illustrated in FIG. 2 has point symmetry about the center of the basic array pattern (the center of the 4 G filters). Moreover, as illustrated in FIG. 3, each of the A array and the B array inside the basic array pattern also respectively have point symmetry about the central G filters, and also have top-bottom and left-right symmetry (line symmetry).

This symmetry enables the circuit scale of a processing circuit at a later stage to be made smaller, and to be simplified.

Feature (6)

Figure 6:
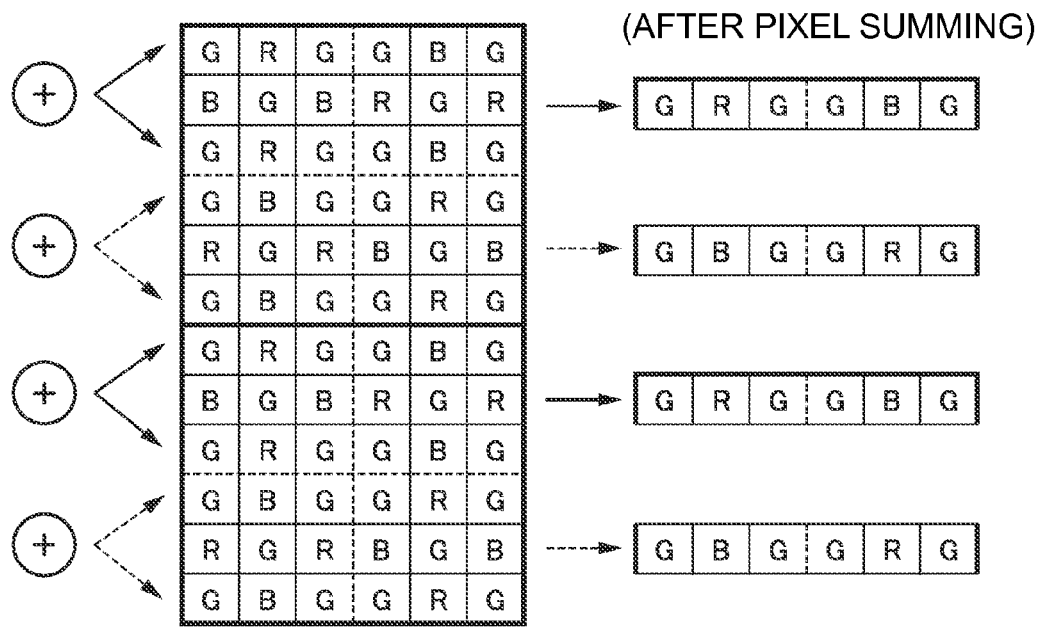
FIG. 6 is an explanatory diagram regarding pixel summing processing according to the first exemplary embodiment.

The basic array pattern P that configures the color filter array illustrated in FIG. 2 includes plural matching array lines that include at least one of each of the G filter, the R filter, and the B filter. For example, as illustrated in FIG. 6, the $1^{st}$ line the $3^{rd}$ line, the $4^{th}$ line, and the $6^{th}$ line in the vertical direction are matching arrays. Consequently, in cases in which matching thinned reading is performed, an improvement in the S/N ratio of the image is enabled by reading line image data of the matching arrays and pixel summing.

The image capture processing section 16 performs predetermined processing on image capture signals output from the image pickup device 14, such as amplification processing, correlation double sampling processing and A/D conversion processing, and then outputs these as image data to the image processing section 20.

The image processing section 20 subjects the image data output from the image capture processing section 16 to what is referred to as synchronization processing. Namely, for all the pixels, interpolation is performed of image data for colors other than the corresponding respective color from pixel data of peripheral pixels, so as to generate R, G, B image data for all pixels. Then, what is referred to as YC conversion processing is performed to the generated R, G, B image data, to generate brightness data Y and color difference data Cr, Cb. Resizing processing is then performed to re-size these signals to a size according to the image capture mode.

The drive section 22 performs driving such as reading image capture signals from the image pickup device 14 according to instruction from the controller 24.

The controller 24 performs overall control, such as of the drive section 22 and the image processing section 20, according to such factors as the image capture mode. Detailed description is given later, however, briefly, the controller 24 instructs the drive section 22 to read image capture signals with a reading method according to the image capture mode, and instructs the image processing section 20 to perform image processing according to the image capture mode.

Since, depending on the image capture mode, there is a need to thin and read the image capture signals from the image pickup device 14, the controller 24 instructs the drive section 22 so as to thin with a thinning method according to the instructed image capture mode and to read the image capture signals.

As the image capture mode, there is a still image mode that captures a still image, and video modes, including an HD video mode that thins a captured image and generates High Definition (HD) video data at a comparatively high resolution and records this on a recording medium such as a memory card, not illustrated in the drawings, and a through video mode (live-view mode) in which a captured image is thinned and a through video (live-view image) of comparatively low resolution is output to a display section, not illustrated in the drawings. However, the type of image capture mode is not limited thereto.

Figure 7:
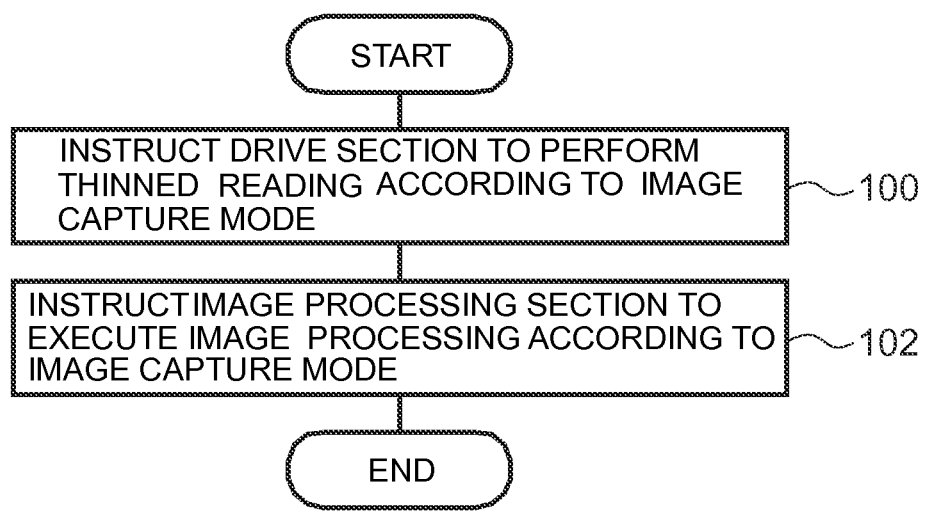
FIG. 7 is a flow chart illustrating processing executed by a control section.

Explanation next follows regarding processing executed by the controller 24 as operation of the present exemplary embodiment, with reference to the flow chart illustrated in FIG. 7.

Note that the processing illustrated in FIG. 7 is executed in cases in which instruction is given to execute image capture according to the image capture mode. The following explanation describes a case in which line image data is read at predetermined positions in the vertical direction, namely a case in which reading is performed in which lines other than lines at the predetermined positions in the vertical direction are thinned (left out). The line image data in this case is a collection of pixel data of pixels in a row running along the horizontal direction.

First, at step 100, the drive section 22 is instructed to read image data using a thinning method corresponding to the image capture mode.

In the present exemplary embodiment, the drive section 22 is instructed to read line image data of each of the matching array lines in the basic array pattern P from the image pickup device 14 (in the present exemplary embodiment the drive section 22 and the controller 24 correspond to the line image data generation means). Specifically, as illustrated in FIG. 6, the drive section 22 is instructed to read the $1^{st}$ line, the $3^{rd}$ line, the $4^{th}$ line, and the $6^{th}$ line of the basic array pattern P. The line image data of the $1^{st}$ line, the $3^{rd}$ line, the $4^{th}$ line, and the $6^{th}$ line in the basic array pattern P are each read thereby.

At step 102, the image processing section 20 is instructed such that pixel summing processing is executed that sums together pixels that are the same color pixel as each other in line image data of read matching arrays, and image processing (for example, synchronization processing (mosaic processing), YC conversion processing, resize processing, or the like) is executed on the image data after pixel summing processing, according to the image capture mode (in the present exemplary embodiment, the image processing section 20 and the controller 24 correspond to the pixel summing section and the image data generation section).

Thereby, pixels that are the same color pixel as each other in the line image data of the $1^{st}$ line, the $3^{rd}$ line are summed together, and pixels that are the same color pixel as each other in the line image data of the $4^{th}$ line, and the $6^{th}$ line are summed together, as illustrated in FIG. 6.

Note that the controller 24 and the image processing section 20 may be configured by a computer including, a CPU, ROM, RAM and non-volatile ROM. In such cases, the processing program for the above processing may for example, be pre-stored on the non-volatile ROM, and may be executed by reading by the CPU.

Accordingly in the present exemplary embodiment, since the color filter includes plural lines of matching arrays in the basic array pattern P, and pixel summing processing is executed that sums together pixels in line image data of read matching arrays that are the same color pixel as each other, an improvement in the S/N ratio of the image is enabled.

Note that in cases in which 3 or more lines of matching array lines are present in the vertical direction of the basic array pattern P, it is preferable that respective line image data is read of the matching arrays having the closest position to each other in the vertical direction. An image of excellent quality can be obtained thereby.

Moreover, although explanation has been given in the present exemplary embodiment in which pixel values of pixels that are the same color pixel as each other in the line image data of matching arrays are simply summed together, there is no limitation thereto, and weighted summing may be performed.

Second Exemplary Embodiment

Explanation next follows regarding a second exemplary embodiment of the present invention. In the present exemplary embodiment, explanation follows regarding a case in which the image pickup device 14 is driven so as to read line image data of arrays, other than matching arrays that are pixel summed, so as to include at least one of each of the colors R, G, and B along each line in the vertical direction.

In the present exemplary embodiment, at step 100 of FIG. 7, the controller 24 reads line image data of each matching array in the basic array pattern P, and the drive section 22 is instructed to read line image data of arrays other than these matching array lines, such that the image after reading, includes at least one of each of the colors R, G, and B in each line running along the vertical direction.

Figure 8:
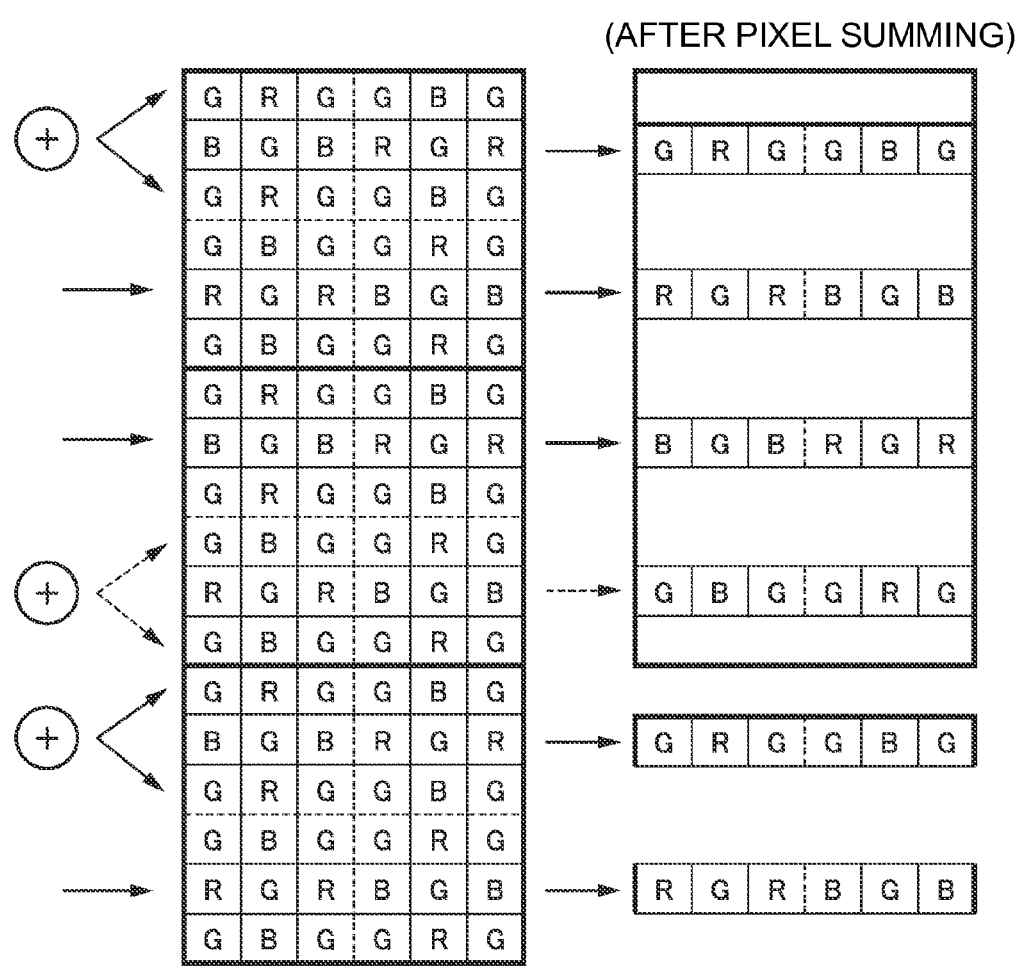
FIG. 8 is an explanatory diagram regarding pixel summing processing according to a second exemplary embodiment.

Specifically, as illustrated in FIG. 8, the drive section 22 is instructed to read line image data from the $1^{st}$ line and the $3^{rd}$ line as matching may lines, from the $5^{th}$ line and the $8^{th}$ line as lines having an array different to that of the matching array lines, from the $10^{th}$ line and the $12^{th}$ line as matching array lines, and so on.

Then at step 102, the image processing section 20 is instructed to execute pixel summing processing that sums together pixels that are the same color pixel as each other in line image data of the read matching arrays. The $1^{st}$ line and the 3rd line, and the 10th line and the 12th line, are thereby respectively pixel summed. The image after pixel summing is sequentially disposed with the line that is the pixel summed 1st line and 3rd line, the line that was the 5th line, the line that was the 8th line, the line that is the pixel summed 10th line and 12th line, and so on.

This thereby means that, as illustrated in FIG. 8, at least one of each of the colors R, G, and B are thereby included in each line running along the vertical direction in the image after pixel summing. Therefore, an improvement in the image quality of the image after pixel summing is enabled, compared to cases in which there are only G image pixels placed in lines running along the vertical direction, as illustrated in FIG. 6.

Third Exemplary Embodiment

Explanation next follows regarding a third exemplary embodiment of the present invention. In the present exemplary embodiment, explanation follows regarding a case in which the image pickup device 14 is driven so as to read line image data at positions in the vertical direction at positions sandwiched by the matching array lines.

In the present exemplary embodiment, at step 100 of FIG. 7, the controller 24 instructs the drive section 22 to read line image data of each matching array line in the basic array pattern P, and to read line image data at positions in the vertical direction that are at positions sandwiched by the matching array lines.

Figure 9:
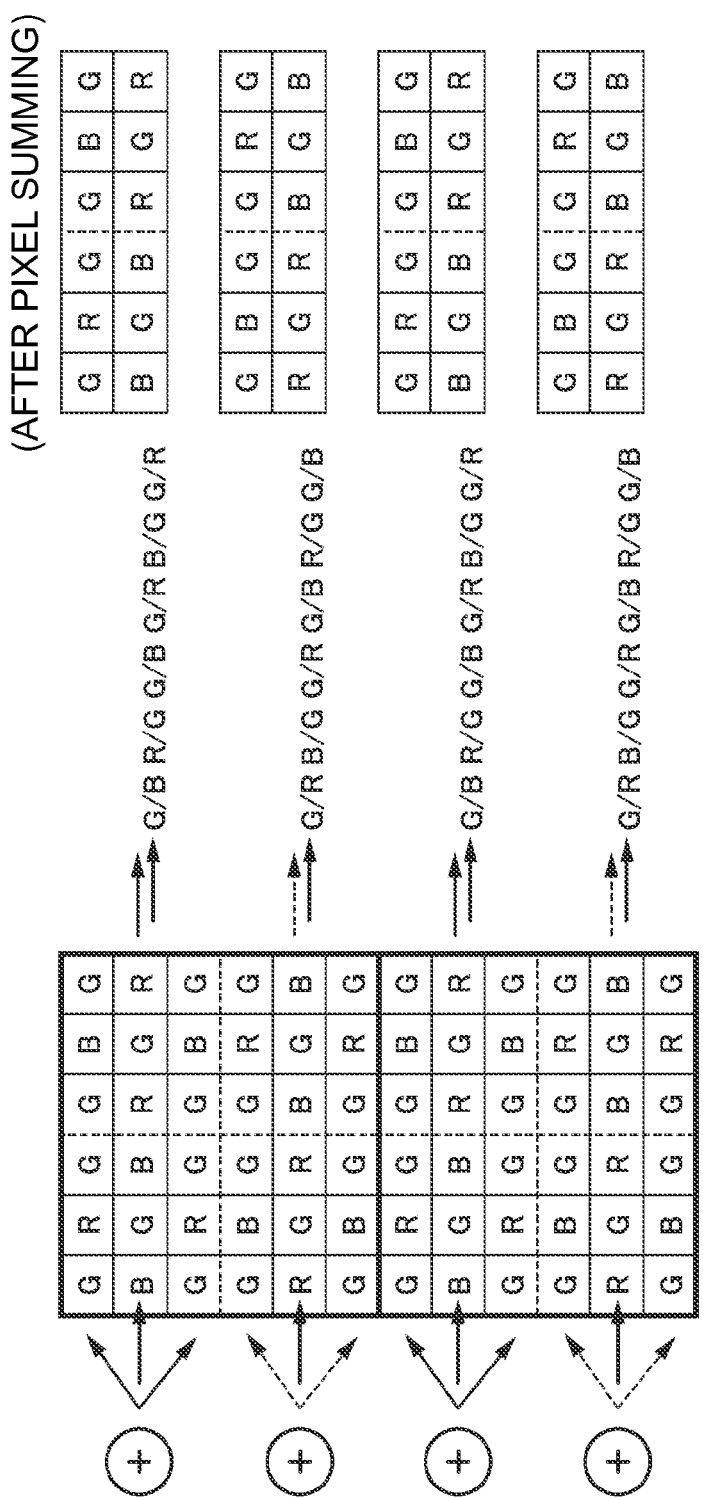
FIG. 9 is an explanatory diagram regarding pixel summing processing according to a third exemplary embodiment.

Specifically, as illustrated in FIG. 9, the drive section 22 is instructed to read line image data of the 1st line and the 3rd line as matching array lines in the basic array pattern P, the 2nd line that is sandwiched by the 1st line and the 3rd line, the 4th line and the 6th line, and the 5th line that is sandwiched by the 4th line and the 6th line.

Then at step 102, the image processing section 20 is instructed to execute pixel summing processing that sums together pixels that are the same color pixel as each other in line image data of read matching arrays. Pixel summing is thereby respectively performed on the 1st line and the 3rd line, and the 4th line and the 6th line. The image after pixel summing is thereby sequentially disposed with, the line that is the pixel summed 1st line and 3rd line after pixel summing, the line that was the 2nd line, the line that is the pixel summed 4th line and 6th line, and the 5th line.

Therefore, since line image data is respectively read and pixel summed for matching array lines, and line image data is read at positions in the vertical direction that are at positions sandwiched by the matching array lines, the center of gravity in the vertical direction of the line image data that is pixel summed, matches the position of line image data at the position sandwiched by the matching array lines. Then, as illustrated in FIG. 8, the image after pixel summing includes at least one of each of the colors R, G and B in each line running along the vertical direction. Therefore, compared to cases in which only G pixels are disposed in line(s) running along the vertical direction, as illustrated in FIG. 6, an improvement in the precision of synchronization processing (mosaic processing) is enabled and an improvement in the image quality is enabled in the image after pixel summing.

Fourth Exemplary Embodiment

Explanation next follows regarding a fourth exemplary embodiment of the present invention. Explanation is given of a modified example of a color filter in the present exemplary embodiment.

Figure 10:
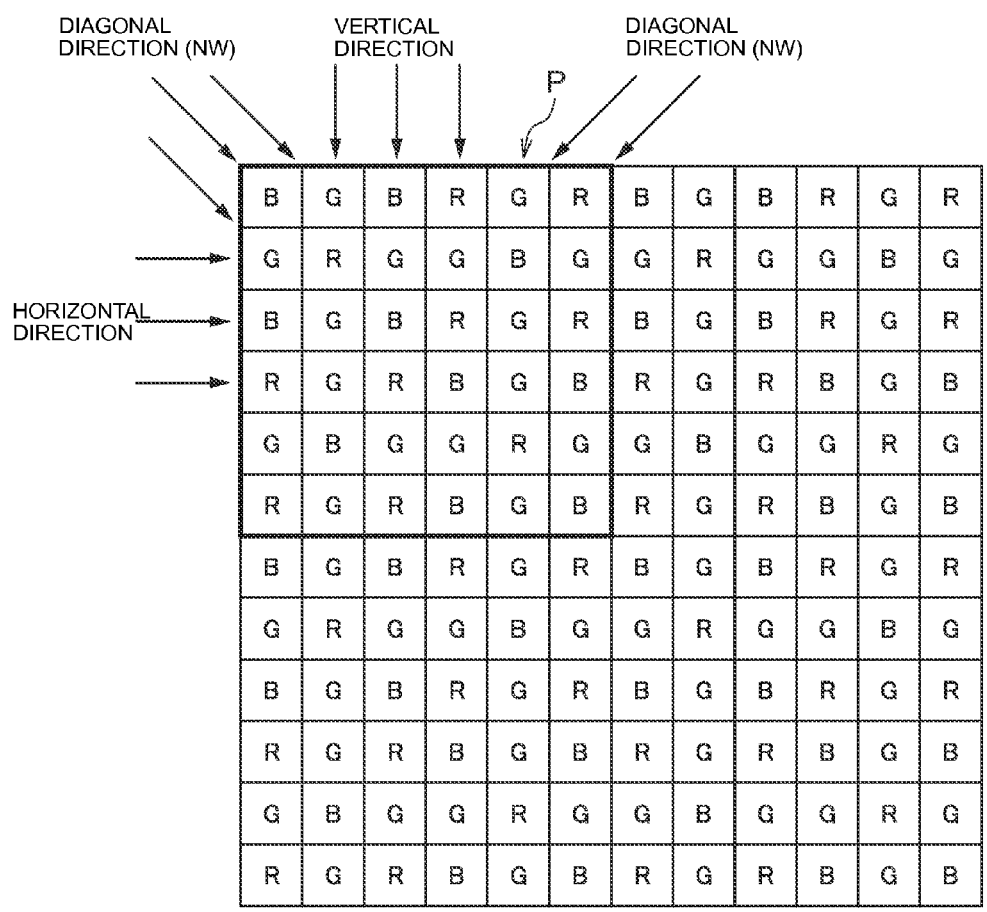
FIG. 10 is a configuration diagram of a color filter according to a fourth exemplary embodiment.

FIG. 10 illustrates a color filter according to the present exemplary embodiment. The color filter according to the present exemplary embodiment, as illustrated in FIG. 10, includes a basic array pattern P (the pattern indicated by the bold flame) formed from a square array pattern corresponding to 6×6 pixels, with the basic array pattern P disposed so as to repeat in both the horizontal direction and the vertical direction. Namely, the color filter array has the respective filters of each color R, G, B (the R filters, G filters, B filters) arrayed at a specific periodicity.

Moreover, in the color filter array illustrated in FIG. 10, the G filter is placed in each line of the color filter array in both the vertical direction and horizontal direction.

Moreover, in the color filter array illustrated in FIG. 10, one or more respectively of the R filter and the B filter is placed in the basic array pattern P in each of the lines of the color filter array in both the vertical direction and horizontal direction.

Figure 11:
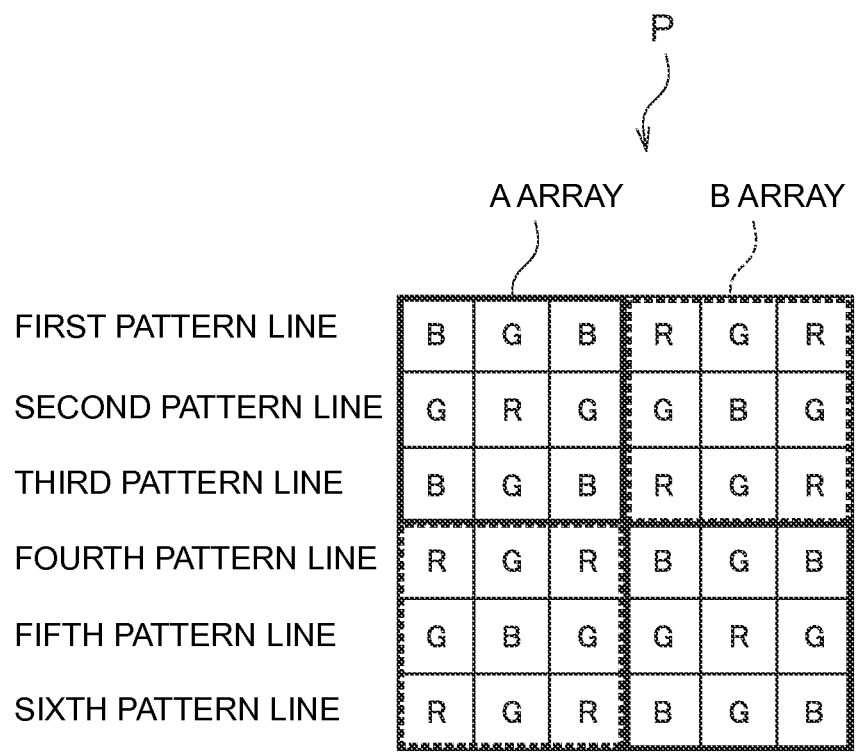
FIG. 11 is a diagram illustrating a basic array pattern contained in a color filter according to the fourth exemplary embodiment.

FIG. 11 illustrates a state in which the basic array pattern P illustrated in FIG. 10 has been divided into 4 sets of 3×3 pixels.

The basic array pattern P illustrated in FIG. 11 may be perceived as an A array of the 3×3 pixels surrounded by the solid line frame, and a B array of the 3×3 pixels surrounded by the broken line frame, alternately disposed along the horizontal and vertical directions.

In the A array, the R filter is placed at the center, and the B filters are placed at the 4 corners, and G filters are placed on both sides of the central R filter at the top and bottom, and left and right. However in the B array the B filter is placed at the center, and the R filters are placed at the 4 corners, and G filters are placed on both sides of the central B filter at the top and bottom, and left and right. Namely, the A array and the B array have reverse positional relationships for the R filters and the B filters, but have similar placement otherwise.

Figures 12A, 12B:
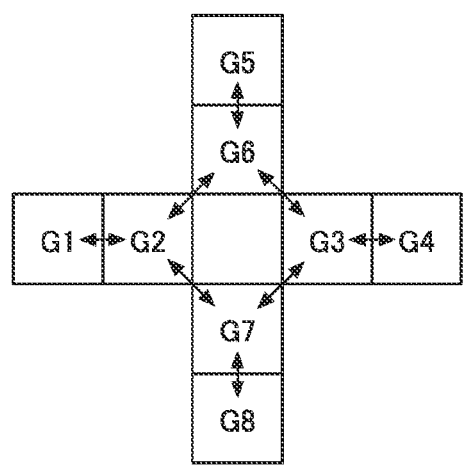
FIG. 12A is a diagram illustrating a color filter in which 6×6 pixel basic array patterns contained in a color filter according to the fourth exemplary embodiment are split into 3×3 pixel A arrays and B arrays that are repeatedly disposed along a horizontal direction and a vertical direction.
FIG. 12B is a diagram illustrating a distinctive placement of G pixels in a color filter according to the fourth exemplary embodiment.

As illustrated in FIG. 12A, the color filter of the first exemplary embodiment may be perceived as the A array and the B array arrayed alternately in the vertical direction and the horizontal direction.

As illustrated in FIG. 12A, when a 5×5 pixel local region (a region illustrated by a bold line frame) centered on an A array is extracted from a mosaic image output from the image pickup device 14, the 8 individual G pixels within this local region are placed in a cross shape, as illustrated in FIG. 12B. The G pixels therein are denoted, in sequence from left to right, G1, G2, G3, G4, and in sequence from top to bottom, G5, G6, G7, G8. Thus the pixels G1, G2, and the pixels G3, G4 are in adjacent contact with each other in the horizontal direction, the pixels G5, G6 and the pixels G7, G8 are in adjacent contact with each other in the vertical direction, the pixels G6, G3 and the pixels G2, G7 are in adjacent contact with each other in the diagonal direction toward the top left, and the pixels G6. G2 and the pixels G3, G7 are in adjacent contact with each other in the diagonal direction toward the top right.

Thus deriving the difference absolute values of the pixel values of these adjacent pixels, enables the direction from out of each of the horizontal, vertical and diagonal directions (NE, NW) that has the smallest change in brightness (the correlation direction with the highest correlation) to be determined by the minimum pixel separation.

Namely, the sum of the difference absolute values in the horizontal direction is |G1−G2|+|G3−G4|, the sum of the difference absolute values in the vertical direction is |G5−G6|+|G7−G8|, the sum of the difference absolute values in the diagonal direction towards the top right is |G6−G2|+|G3−G7|, and the sum of the difference absolute values in the diagonal direction towards the top left is |G6−G3|+|G2−G7|.

The correlation (correlation direction) can then be determined as the direction with the smallest difference absolute value out of these four correlation absolute values. Note that the determined correlation direction can be employed during the performance of processing, such as synchronization processing.

The basic array pattern P that configures the color filter illustrated in FIG. 10 has point symmetry about the center of the basic array pattern P.

As illustrated in FIG. 11, the A array and the B array within the basic array pattern each have point symmetry about a central R filter, or B filter, and are top-bottom and left-right symmetrical (have line symmetry).

Moreover, the basic array pattern P that configures the color filter illustrated in FIG. 10 includes plural matching array lines that include at least one of each of the G filters, the R filters and the B filters. For example, as illustrated in FIG. 10, the $1^{st}$ line and the $3^{rd}$ line, and the $4^{th}$ line and the $6^{th}$ line in the vertical direction are matching arrays. Consequently, in cases in which thinned reading is performed, an improvement in the S/N ratio of the image is enabled by reading line image data of matching arrays and pixel summing.

Thus the color filter according to the present exemplary embodiment has characteristics that are the same as the features (1), and (3) to (6) of the color filter according to the first exemplary embodiment.

Note that the color filter is not limited to those described in each of the exemplary embodiments, and the present invention may also be applied to an imaging apparatus having an image pickup device with the following color filter array.

Figure 13:
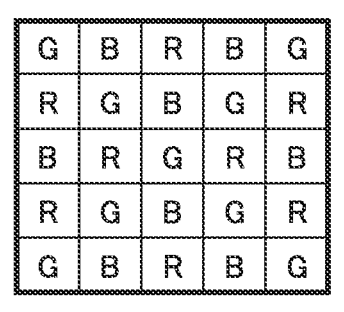

For example, as a color filter array having the above features (1), (2), (3), and (6) there is a color filter array in which a basic array pattern P is the 5×5 pixel color filter, as illustrated in FIG. 13. This color filter array is configured by a repeating basic array pattern set with G placed along the two diagonal directions in the 5×5 pixels, and with R, B pixels placed on the remaining pixel positions such that there is 1 or more of each placed in each of the horizontal direction and vertical direction lines in the 5×5 pixels, set such the number of G is greater than the number of R and the number of B. As well as this, there is a color filter array of 7×7 pixels of a basic array pattern P such as that illustrated in FIG. 14 and the like.

Since these color filters have the feature (6), improving the S/N ratio of an image is enabled by reading line image data of matching arrays and summing pixels that are the same color pixel as each other.

Note that in consideration of the ease of image processing, such as synchronization processing or thinning processing during video image capture, preferably N, M are each 10 or lower.

Moreover although explanation has been given in the above exemplary embodiment of a case in which there is a color image pickup device having 3 primary color filters, RGB, the present invention is not limited thereto, and application may be made to a color filter having 4 colors of the three primary colors RGB+one other color (for example, emerald (E)), such as for example the color filter illustrated in FIG. 15. Moreover, the present invention may be applied to a color filter having a white or transparent (W) filter as the other color. For example, a W filter may be placed instead of the emerald of FIG. 15. In such cases, a combination of W and G, or W is the first color that contributes most to the brightness signal.

Moreover, the present invention may be applied to a color image pickup device including a color filter with a complementary color system of 4 colors with, in addition to G, C (cyan), M (magenta) and Y (yellow), that are the complementary colors of the primary colors RGB.

Moreover, in each of the above exemplary embodiments, explanation has been given of cases in which line image data naming along the horizontal direction are read at a predetermined cycle in the vertical direction, however the present invention is also applicable to cases in which the line image data naming along the vertical direction are read at a predetermined cycle in the horizontal direction.

Moreover, in the present exemplary embodiment, explanation has been given regarding a case in which line image data of matching array lines in the basic array pattern P are respectively read from the image pickup device 14 and line image data generated, and pixel summing performed thereon. However, configuration may be made such that pixel signals of pixels are read for all lines, and line image data of matching arrays in the basic array pattern P are selectively used (Without using, or without storing, line image data of other lines), and these lines then pixel summed. Moreover, configuration may be made such that pixel signals of pixels for all lines are read and temporarily stored in memory of RAM or the like, and line image data of matching array lines in the basic array pattern P used selectively, and pixel summing performed thereon (in the case of this embodiment, the image capture processing section 16 or the image processing section 20 corresponds to the line image data generation means)

Moreover, in the present exemplary embodiment, explanation has been given regarding a case in which line image data of matching array lines in the basic array pattern P are respectively read from the image pickup device 14, line image data generated, and pixel summing performed thereon. However, pixel summing may be performed in the image pickup device 14. In particular, a greater reduction in video processing time is enabled by performing pixel summing (pixel mixing) in the image pickup device 14 directly after reading (in the case of this embodiment, the image pickup device 14 and the drive section 22 correspond to the line image data generation means and the pixel summing means).

It goes without saying that the present invention is not limited by the exemplary embodiments that are described above, and various other modifications may be implemented within a range not departing from the spirit of the present invention.

What is claimed is:

1. An imaging apparatus comprising:
   an image pickup device comprising a plurality of photoelectric conversion elements arrayed in a predetermined first direction and a second direction intersecting with the first direction;
   a color filter that is provided above a plurality of pixels configured by the plurality of photoelectric conversion elements, the color filter having a repeatedly disposed basic array pattern of array lines that each include in the second direction at least one of each of a first filter corresponding to a first color that contributes most to obtaining a brightness signal or each of a plurality of second filters respectively corresponding to 2 or more second colors other than the first color, and include a plurality of matching array lines that have the same array as each other along the second direction, and at least one array line that has a different array for the first filter and the second filters in the second direction to that of the matching array lines;
   a line image data generation section that reads pixel signals of the plurality of pixels at a set cycle from the image pickup device, and, from the read pixel signals, generates, from out of the plurality of pixels, line image data of each of the matching array lines in the basic any pattern;
a pixel summing section that sums together pixels that are the same color pixel as each other in the generated line image data for the matching array lines; and
an image data generation section that generates image data based on the line image data that has been pixel summed.

2. The imaging apparatus of claim 1, wherein:
the line image data generation section generates line image data that has a different array for each of the first color and each of the 2 or more second colors to that of the matching array lines such that there is at least one each of the first color and each of the 2 or more second colors included in each line running along the first direction.

3. The imaging apparatus of claim 1, wherein:
the line image data generation section generates line image data with positions in the first direction at positions sandwiched by the matching array lines.

4. The imaging apparatus of claim 1, wherein:
the line image data generation section generates line image data of the matching array lines having the closest position to each other in the first direction.

5. The imaging apparatus of claim 1, wherein:
the line image data generation section, as the set cycle for reading pixel signals of the plurality of pixels from the image pickup device, reads the pixel signals of the matching array lines in the basic array pattern out of the plurality of pixels and generates line image data.

6. The imaging apparatus of claim 1, wherein:
at least one of the first filters is placed in each line in the color filter in the first direction, the second direction, and third directions that intersect with the first direction and the second direction; and
at least one of each of a plurality of the second filters is placed in each line of the basic array pattern in the first direction and the second direction.

7. The imaging apparatus of claim 1, wherein:
the color filter includes a square array corresponding to 2×2 pixels configured from the first filter.

8. The imaging apparatus of claim 1, wherein:
the first color is green (G), and the second colors are red (R) and blue (B).

9. The imaging apparatus of claim 8, wherein:
the color filter includes an R filter, a G filter, and a B filter corresponding to colors red (R), green (G) and blue (B); and
the color filter is configured by a first array and a second array alternately arrayed in the first direction and the second direction, wherein the first array corresponds to 3×3 pixels with the G filter placed at the center and the 4 corners, the B filter placed at the top and bottom of the central G filter, and the R filter placed at the left and right of the central G filter, and the second array corresponds to 3×3 pixels with the G filter placed at the center and the 4 corners, the R filter placed at the top and bottom of the central G filter, and the B filter placed at the left and right of the central G filter.

10. The imaging apparatus of claim 8, wherein:
the color filter includes an R filter, a G filter, and a B filter corresponding to colors red (R), green (G) and blue (B); and
the color filter is configured by a first array and a second array alternately arrayed in the first direction and the second direction, wherein the first array corresponds to 3×3 pixels with the R filter placed at the center, the B filter placed at the 4 corners, and the G filter placed at the top, bottom, left and right of the central R filter, and the second array corresponds to 3×3 pixels with the B filter placed at the center, the R filter placed at the 4 corners, and the G filter placed at the top, bottom, left and right of the central B filter.

11. The imaging apparatus of claim 1, wherein:
the color filter has line point symmetry about the center of the basic array pattern.

12. A control method for an imaging apparatus equipped with an image pickup device comprising a plurality of photoelectric conversion elements arrayed in a predetermined first direction and a second direction intersecting with the first direction, and a color filter that is provided above a plurality of pixels configured by the plurality of photoelectric conversion elements, the color filter having a repeatedly disposed basic array pattern of array lines that each include in the second direction at least one of each of a first filter corresponding to a first color that contributes most to obtaining a brightness signal or each of a plurality of second filters respectively corresponding to 2 or more second colors other than the first color, and include a plurality of matching array lines that have the same array as each other along the second direction, and at least one array line that has a different array for the first filter and the second filters in the second direction to that of the matching array lines, the control method for an imaging apparatus comprising:
a line image data, generation section that reads pixel signals of the plurality of pixels at a set cycle from the image pickup device, and, from the read pixel signals, generates, from out of the plurality of pixels, line image data of each of the matching array lines in the basic array pattern;
a pixel summing section that sums together pixels that are the same color pixel as each other in the generated line image data for the matching array lines; and
an image data generation section that generates image data based on the line image data that has been pixel summed.

13. A non-transitory storage medium storing a control program that causes processing to be executed in a computer that controls an imaging apparatus equipped with an image pickup device comprising a plurality of photoelectric conversion elements arrayed in a predetermined first direction and a second direction intersecting with the first direction, and a color filter that is provided above a plurality of pixels configured by the plurality of photoelectric conversion elements, the color filter having a repeatedly disposed basic array pattern of array lines that each include in the second direction at least one of each of a first filter corresponding to a first color that contributes most to obtaining a brightness signal or each of a plurality of second filters respectively corresponding to 2 or more second colors other than the first color, and include a plurality of matching array lines that have the same array as each other along the second direction, and at least one array line that has a different array for the first filter and the second filters in the second direction to that of the matching array lines, the control program comprising:
a step of reading pixel signals of the plurality of pixels at a set cycle from the image pickup device;
a step of, from the read pixel signals, generating, from out of the plurality of pixels, line image data of each of the matching array lines in the basic array pattern;
a step of summing together pixels that are the same color pixel as each other in the generated line image data for the matching array lines; and
a step of generating image data based on the line image data that has been pixel summed.

14. A non-transitory storage medium storing a control program that causes processing to be executed in a computer, the processing comprising:
- a step of generating line image data from pixel signals of pixel signals in a plurality of pixels read at a set cycle from an image pickup device comprising a plurality of photoelectric conversion elements arrayed in a predetermined first direction and a second direction intersecting with the first direction, and a color filter that is provided above a plurality of pixels configured by the plurality of photoelectric conversion elements, the color filter having a repeatedly disposed basic array pattern of array lines that each include in the second direction at least one of each of a first filter corresponding to a first color that contributes most to obtaining a brightness signal or each of a plurality of second filters respectively corresponding to 2 or more second colors other than the first color, and include a plurality of matching array lines that have the same array as each other along the second direction, and at least one array line that has a different array for the first filter and the second filters in the second direction to that of the matching array lines, the line image data being generated for the matching array lines in the basic array pattern out of the plurality of pixels;
- a step of summing together pixels that are the same color pixel as each other in the generated line image data for the matching array lines; and
- a step of generating image data based on the line image data that has been pixel summed.

* * * * *